(12) United States Patent
Peng et al.

(10) Patent No.: US 12,014,129 B2
(45) Date of Patent: Jun. 18, 2024

(54) CIRCUIT DESIGN VISIBILITY IN INTEGRATED CIRCUIT DEVICES

(71) Applicant: Intel Corporation, Santa Clara, CA (US)

(72) Inventors: Yi Peng, Newark, CA (US); Brandon Lewis Gordon, Campell, CA (US)

(73) Assignee: Intel Corporation, Santa Clara, CA (US)

( * ) Notice: Subject to any disclaimer, the term of this patent is extended or adjusted under 35 U.S.C. 154(b) by 668 days.

(21) Appl. No.: 17/033,208

(22) Filed: Sep. 25, 2020

(65) Prior Publication Data

US 2021/0012051 A1    Jan. 14, 2021

(51) Int. Cl.
*G06F 30/343* (2020.01)
*G06F 30/327* (2020.01)
*G06F 30/3308* (2020.01)
*G06F 30/367* (2020.01)
*G06F 30/398* (2020.01)

(52) U.S. Cl.
CPC .......... *G06F 30/343* (2020.01); *G06F 30/327* (2020.01); *G06F 30/3308* (2020.01); *G06F 30/367* (2020.01); *G06F 30/398* (2020.01)

(58) Field of Classification Search
CPC .. G06F 30/343; G06F 30/327; G06F 30/3308; G06F 30/367; G06F 30/398
USPC ..... 716/104, 106, 111, 136; 703/15; 714/30, 714/39, 725, 726, 732
See application file for complete search history.

(56) References Cited

U.S. PATENT DOCUMENTS

| | | | | |
|---|---|---|---|---|
| 4,766,532 A | * | 8/1988 | Pearson | H03K 19/1733 711/217 |
| 4,980,817 A | * | 12/1990 | Fossum | G06F 9/30141 712/E9.027 |
| 6,683,854 B1 | * | 1/2004 | Blanc | H04L 1/24 714/821 |
| 7,370,299 B2 | * | 5/2008 | Huang | G06F 30/33 716/109 |
| 7,827,517 B1 | * | 11/2010 | Orthner | G06F 30/30 703/14 |
| 9,298,865 B1 | * | 3/2016 | Peng | G06F 30/33 |
| 10,284,185 B1 | * | 5/2019 | Gaide | H03K 19/096 |
| 2008/0115019 A1 | * | 5/2008 | Ngo | G01R 31/31727 714/724 |

FOREIGN PATENT DOCUMENTS

JP         2007018403 A  *  1/2007

\* cited by examiner

*Primary Examiner* — Phallaka Kik
(74) *Attorney, Agent, or Firm* — Fletcher Yoder, P.C.

(57) ABSTRACT

A system includes an integrated circuit device configured to implement a circuit design. The integrated circuit device includes a communication interface configured to receive the circuit design in a configuration bitstream and instrumentation logic in the configuration bitstream and signal collector block configured to collect signal data based on the instrumentation logic during implementation of the circuit design.

9 Claims, 6 Drawing Sheets

CIRCUIT DESIGN VISIBILITY IN INTEGRATED CIRCUIT DEVICES

BACKGROUND

The present disclosure relates generally to integrated circuit (IC) devices such as programmable logic devices (PLDs). More particularly, the present disclosure relates to visualization of circuit designs using PLDs, such as field programmable gate arrays (FPGAs), application specific integrated circuits (ASICs), and so forth.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuit devices may be utilized for a variety of purposes or applications and programmable logic devices may be utilized to perform these functions. Visualizing implemented circuit designs can assist users in identifying issues, debugging programs, and performing error detection and/or correction. Design visibility can be provided by tapping signals (e.g., inputs, outputs) of a circuit during implementation on a programmable logic device. However, the design visibility of a programmable logic device may be limited by the amount of hardware resources available for debugging and, in particular, the amount of memory which is used to determine how design signals are instrumented and how many data points are collected. In some cases, a designer (e.g., person, group, company, entity) responsible for the circuit design of a programmable logic device may be different than a user (e.g., person, group, company, entity) responsible for implementing the circuit on the programmable logic device. As such, the user of the programmable logic device must choose the design signals to instrument based on the available memory and may not have sufficient knowledge of the circuit design. In some cases, compilation of the instrumentation logic may be a long process and the user may go through several iterations of compiling and re-instrumenting before locating a problem.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "including" and "having" are intended to be inclusive and mean that there may be additional elements other than the listed elements. Additionally, it should be understood that references to "some embodiments," "embodiments," "one embodiment," or "an embodiment" of the present disclosure are not intended to be interpreted as excluding the existence of additional embodiments that also incorporate the recited features. Furthermore, the phrase A "based on" B is intended to mean that A is at least partially based on B. Moreover, the term "or" is intended to be inclusive (e.g., logical OR) and not exclusive (e.g., logical XOR). In other words, the phrase A "or" B is intended to mean A, B, or both A and B.

As programmable logic device applications have become ever more prevalent, there is a growing desire for efficient methods for visualization of circuit designs for debugging and error detection. The present systems and techniques relate to embodiments of systems and methods for visualization of circuit designs for debugging and error detection in programmable logic devices. A user may be responsible for a circuit design of a programmable logic device. In some cases, the circuit design may be a portion of a bitstream (e.g., configuration program) for programming the programmable logic device and the programmable logic device may be a field-programmable gate array (FPGA).

Figure 1:
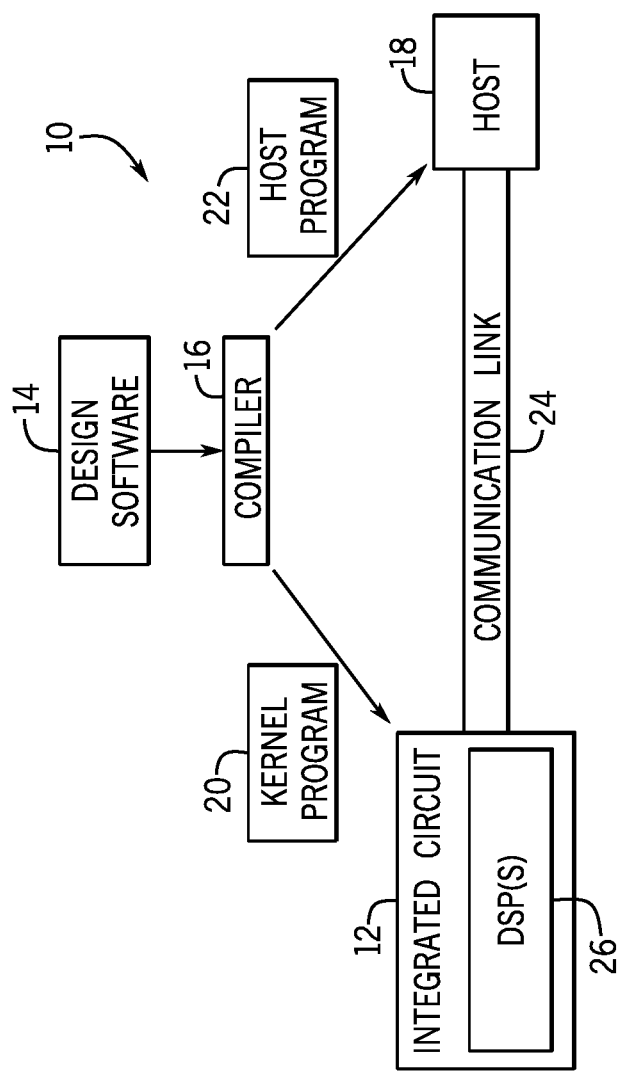
FIG. 1 is a block diagram of a system that may implement arithmetic operations using a DSP block, in accordance with an embodiment of the present disclosure.

With this in mind, FIG. 1 illustrates a block diagram of a system 10 that may implement arithmetic operations using components of an integrated circuit device, such as components of a programmable logic device (e.g., a configurable logic block, an adaptive logic module, a DSP block). A designer may desire to implement functionality, such as the implementation operations of this disclosure, on an integrated circuit device 12 (such as a field-programmable gate array (FPGA), an application-specific integrated circuit (ASIC), a programmable logic array (PLA), and so forth.) In some cases, the designer may specify a high-level program to be implemented, such as an OpenCL program, which may enable the designer to more efficiently and easily provide programming instructions to configure a set of programmable logic cells for the integrated circuit device 12 without specific knowledge of low-level hardware description languages (e.g., Verilog or VHDL). For example, because OpenCL is quite similar to other high-level programming languages, such as C++, designers of programmable logic familiar with such programming languages may have a reduced learning curve than designers that are required to learn unfamiliar low-level hardware description languages to implement new functionalities in the integrated circuit device 12.

The designers may implement their high-level designs using design software 14, such as a version of Intel® Quartus® by INTEL CORPORATION. The design software 14 may use a compiler 16 to convert the high-level program into a lower-level description. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications, peripheral component interconnect express (PCIe) communications, Ethernet communications, Universal Serial Bus (USB) communications, Test Access Port (TAP) communications, or any other suitable communications. In some embodiments, the kernel programs 20 and the host 18 may enable configuration of one or more DSP blocks 26 on the integrated circuit device 12. The DSP block 26 may include circuitry to implement, for example, operations to perform matrix-matrix or matrix-vector multiplication for AI or non-AI data processing. The integrated circuit device 12 may include many (e.g., hundreds or thousands) of the DSP blocks 26. Additionally, DSP blocks 26 may be communicatively coupled to another such that data outputted from one DSP block 26 may be provided to other DSP blocks 26.

While the techniques described above refer to the application of a high-level program, in some embodiments, the designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
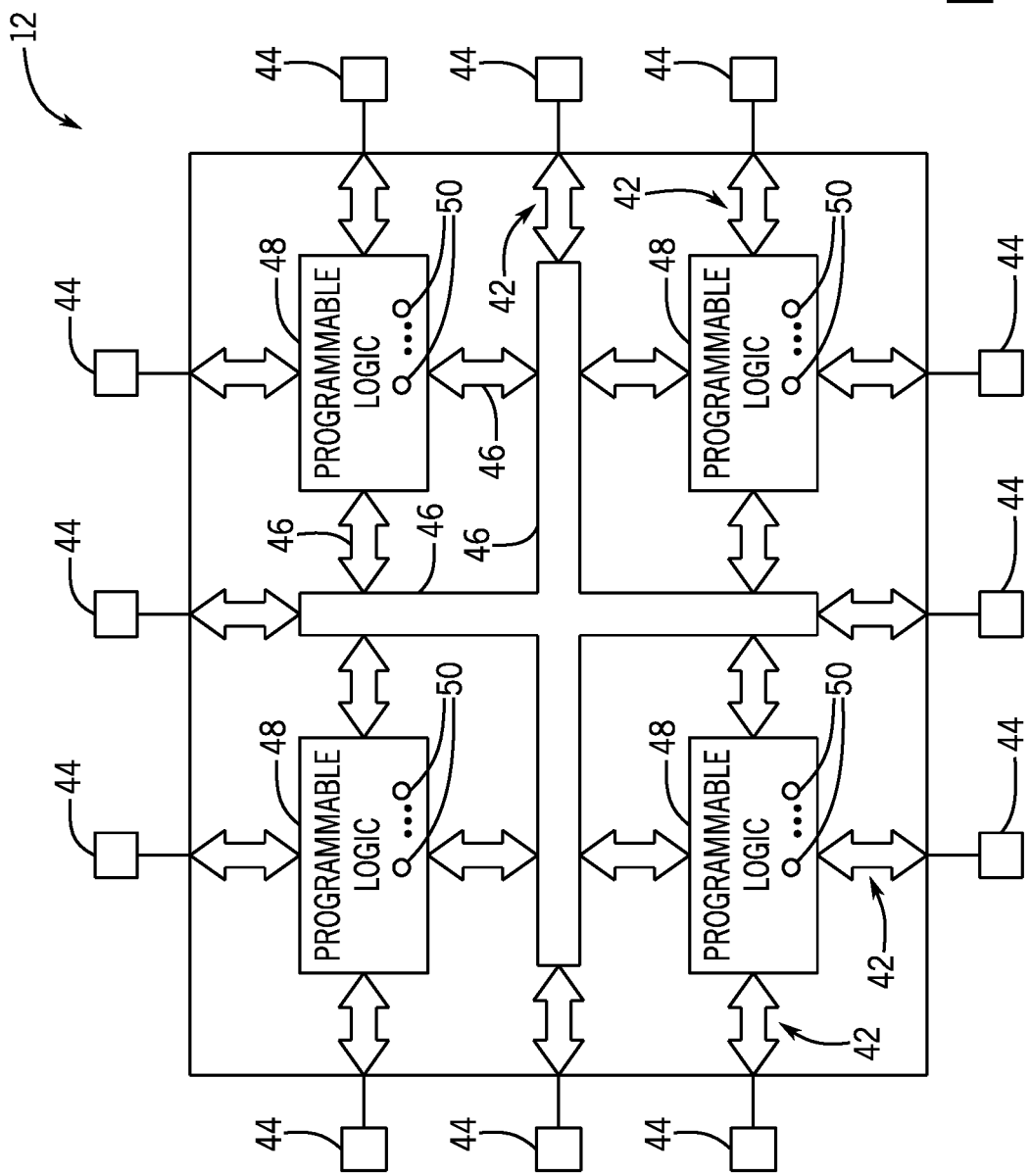
FIG. 2 is a block diagram of the integrated circuit device of FIG. 1, in accordance with an embodiment of the present disclosure.

Turning now to a more detailed discussion of the integrated circuit device 12, FIG. 2 illustrates an example of the integrated circuit device 12 as a programmable logic device, such as a field-programmable gate array (FPGA). Further, it should be understood that the integrated circuit device 12 may be any other suitable type of integrated circuit device (e.g., an application-specific integrated circuit and/or application-specific standard product). As shown, the integrated circuit device 12 may have input/output circuitry 42 for driving signals off device and for receiving signals from other devices via input/output pins 44. Interconnection resources 46, such as global and local vertical and horizontal conductive lines and buses, may be used to route signals on integrated circuit device 12. Additionally, interconnection resources 46 may include fixed interconnects (conductive lines) and programmable interconnects (e.g., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of the programmable logic 48.

Programmable logic devices, such as integrated circuit device 12, may contain programmable elements 50 within the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using pins 44 and input/output circuitry 42. In one embodiment, the memory cells may be implemented as random-access-memory (RAM) cells. The use of memory cells based on RAM technology is described herein is intended to be only one example. Further, because these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Figure 3:
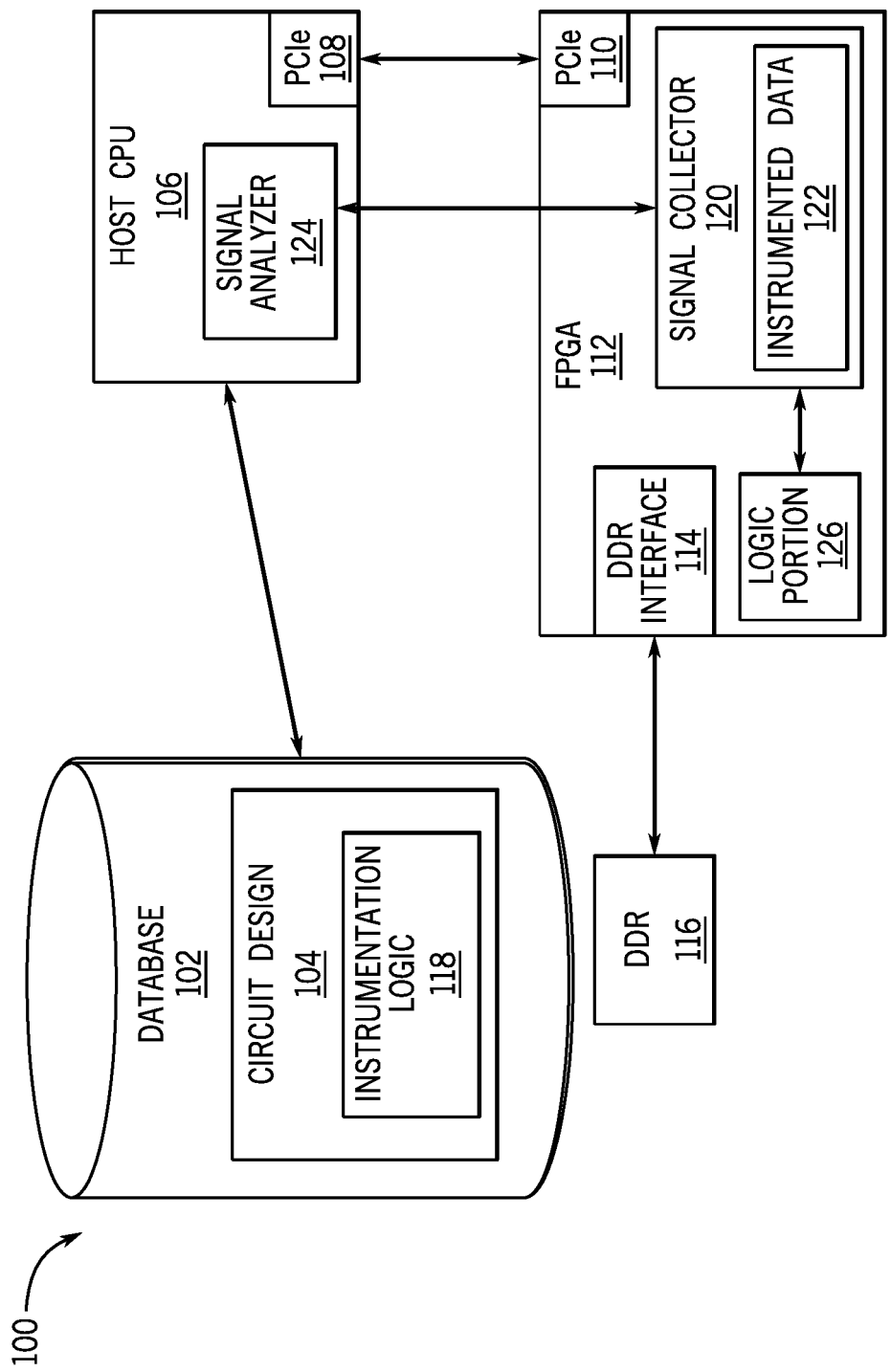
FIG. 3 is a data processing system for debugging a program for a programmable logic device, in accordance with an embodiment of the present disclosure.

FIG. 3 illustrates components of a data processing system 100 used to implement and debug a circuit design for a programmable logic device, in accordance with an embodiment of the present disclosure. As shown, a circuit design 104 may be stored in a database 102. In certain embodiments, the database 102 may be associated with a host, such as host 18 in FIG. 1. In certain embodiments, a first entity may create and/or generate the circuit design 104. The circuit design 104 may be compiled and stored as a set of binary execution codes. In some embodiments, the circuit design 104 may include instrumentation logic 118 and the instrumentation logic 118 may monitor and/or collect signal data when the circuit design 104 is implemented by a programmable logic device, such as FPGA 112. A host processor (e.g., host central processing unit (CPU) 106)) may receive or may retrieve the circuit design 104. The host CPU 106 may transmit a configuration bitstream to the FPGA 112 using a peripheral component interconnect express (PCIe) 108. In certain embodiments, the host CPU 106 may be associated with a second entity, separate from the first entity associated with the creation and/or generation of the circuit design 104. In some embodiments, the configuration bitstream may include a first portion including the circuit design 104 for a programmable logic device, such as FPGA 112. For example, the configuration bitstream may include machine-readable instructions associated with functionality of an integrated circuit device, such as FPGA 112. For example, the configuration bitstream may include machine-readable instructions associated with implementing the circuit design 104. The configuration bitstream may include the circuit design 104 and the instrumentation logic 118 used for collecting signal data during implementation of the circuit design 104. In certain embodiments, the configuration bitstream may include a first portion associated with the circuit design 104 for the programmable logic device and a second portion associated with the instrumentation logic 118. In some embodiments, the instrumentation logic 118 may be provided to the programmable logic device by a remote device via a network. For example, the instrumentation logic 118 may be provided to memory associated with the FPGA 112.

The FPGA 112 may be coupled to the host processor (e.g., host central processing unit (CPU) 106). In certain embodiments, the host CPU 106 may store the circuit design 104 and/or the instrumentation logic 118 in memory associated with the host CPU 106, such as a host double data rate (DDR) memory. In some embodiments, the host DDR memory may transfer the circuit design 104 and/or the instrumentation logic 118 to memory associated with the FPGA 112, such as FPGA DDR memory 116. Additionally or alternatively, the host CPU 106 may transfer the circuit design 104 and/or the instrumentation logic 118 from a remote device to memory associated with the FPGA 112, such as FPGA DDR memory 116. In some embodiments, the instrumentation logic 118 may be deployed from a remote device via a network. The FPGA DDR memory 116 may be separate from, but communicatively coupled to the FPGA 112 using a DDR communication interface 114 that facilitates communication between the FPGA DDR memory 116 and the FPGA 112 according to, for example, the PCIe bus standard. Upon receiving an indication from the host CPU 106, the circuit design 104 and instrumentation logic 118 may be transferred from the FPGA DDR memory 116 to the FPGA 112 using the DDR communication interface 114. In some embodiments, the circuit design 104 and/or the instrumentation logic 118 may be transferred directly from the host CPU 106 to the FPGA 112 using PCIe 108, 110, with or without temporary storage in the host DDR.

In certain embodiments, the instrumentation logic 118 may be transferred to a portion of the FPGA 112 programmed to collect signal data during implementation of the circuit design 104. For example, the instrumentation logic 118 may be transferred to a signal collector 120 of the FPGA 112. The signal collector 120 may collect instrumented data 122 (e.g., signal data) during implementation and/or execution of the circuit design 104 on the FPGA 112. In certain embodiments, the instrumentation logic 118 may include a set of binary execution codes and may instruct the signal collector 120 to collect instrumented data 122 associated with a portion of the FPGA 112, such as logic portion 126. For example, a user may select a portion (e.g., a portion of the implemented circuit design 104) of the circuit implemented on the FPGA 112 for which instrumented data 122 is collected during implementation of the circuit design 104. In some embodiments, the user may select the logic portion 126 based on the user's knowledge of the circuit design 104. For example, the user may select the logic portion 126 based on what the user believes is a bug associated with the circuit design 104. A bug may be any error or incorrect result of a circuit design which differs from an intended result of the circuit design. Additionally or alternatively, the host CPU 106 may select a portion of the circuit based on the circuit design and available hardware resources of the FPGA 112 and the logic portion 126 may be a subset of the circuit design logic.

In some embodiments, the circuit implemented by the circuit design 104 on the FPGA 112 may include a set of registers and each register may have a corresponding set of inputs and a corresponding set of outputs. For example, the set of registers may include a subset of registers associated with a selected portion of the circuit implemented on the FPGA 112. Additionally, the selected logic portion 126 may include a set of inputs and a set of outputs associated with the subset of registers. In certain embodiments, the circuit may also include any number of feedback loops associated with one or more registers of the set of registers. For example, a feedback loop may include two registers where the output from the first register may feed into the input of the second register and the output from the second register may feed back into the input of the first register. Additionally, each register may be associated with any number of feedback loops.

Additionally or alternatively, the instrumentation logic 118 may instruct the signal collector 120 to collect instrumented data 122 associated with one or more registers of the set of registers. For example, the signal collector 120 may sample a data signal associated with a register at a specific time period, such as an input and/or an input of the respective register. In certain embodiments, the instrumentation logic 118 may instruct the signal collector 120 to identify, select, and/or collect data from a subset of registers associated with a selected portion of the circuit implemented on the FPGA 112. For example, the instrumentation logic 118 may include an algorithm for identifying a lowest total number of registers of the subset of registers such that every feedback loop in the selected portion is associated with at least one identified register. As such, the instrumentation logic 118 may select a second subset of identified registers and the signal collector 120 may collect instrumented data 122 by taking one or more samples of each register of the second subset of identified registers. In some embodiments, the signal collector 120 may take a number of samples based on a total number of registers associated with a feedback loop. For example, a first register may be associated with a first feedback loop including three total registers, a second feedback loop including five total registers, and a third feedback loop including seven total registers. As such, the signal collector 120 may take seven samples of the first register at different times during implementation of the circuit. In some embodiments, the signal collector 120 may determine a lowest number of samples that need to be taken such that a corresponding number of samples taken at a register of an associated feedback loop is equal or greater than a number of registers associated with the feedback loop. The signal collector 120 may include an algorithm for determining a minimum number of samples necessary to cover each feedback loop associated with the selected portion of the circuit implemented by the FPGA 112. As such, the signal collector 120 may reduce the overall number of samples taken based on an appropriate selection of registers. For example, the seven samples taken for the first register described above covers three feedback loops.

Additionally or alternatively, the instrumentation logic 118 may instruct the signal collector 120 to collect instrumented data 122 associated with one or more registers for each feedback loop associated with the selected portion of the circuit implemented by the FPGA 112. For example, the signal collector 120 may take a single sample for each register associated with the selected logic portion 126. As such, the signal collector 120 may take a number of samples equal to a number of registers associated with the selected logic portion 126 of the circuit implemented by the FPGA 112. Additionally or alternatively, the instrumentation logic 118 may instruct the signal collector 120 to collect instrumented data 122 associated with any number of inputs, each input associated with at least one register of a subset of registers in the selected logic portion 126.

After collecting the instrumented data 122, generating visualizations of the instrumented data may allow a user and/or the host device to analyze the circuit design and identify errors. As such, the signal collector 120 may transfer the instrumented data 122 to a signal analyzer 124. For example, the FPGA 112 may transmit the instrumented data 122 to the host CPU 106 using the PCIe 110. The host CPU 106 may include the signal analyzer 124 and the signal analyzer 124 may receive and may analyze the instrumented data 122. For example, the signal analyzer 124 may transform the instrumented data 122 and may generate a visualization of the instrumented data 122. As such, the visualization may provide a user with a better understanding of the implementation of the circuit design on the programmable logic device, such as FPGA 112. In certain embodiments, the visualization may display the instrumented data 122 in a waveform format, a signal trace format, a source file debug format, or any combination thereof. Additionally or alternatively, the signal analyzer 124 may use hardware description language to transform the instrumented data 122. In some embodiments, the signal analyzer 124 may utilize a programmable interface, such as Verilog procedural interface, programming language interface, direct programing interface, or the like, to transform the instrumented data 122 into a set of transformed data.

After transforming the instrumented data 122, the signal analyzer 124 may utilize a simulator and may simulate the circuit design 104 based on the instrumented data 122. The signal analyzer 124 may detect one or more errors associated with the implementation of the circuit on the FPGA 112 based on the simulation of the circuit and the implementation of the circuit on the FPGA 112. For example, the signal analyzer 124 may detect inconsistencies between a result of associated with the simulation of the circuit and a result (e.g., instrumented data 122) associated with the implementation of the circuit on the FPGA 112. Additionally or alternatively, the signal analyzer may detect one or more errors based on a model (e.g., register-transfer level) of the circuit generated by the signal analyzer 124 for the simulation and the implementation of the circuit on the FPGA 112. In some embodiments, the signal analyzer 124 may report any number of errors and may generate a visualization including a portion indicative of detected errors.

Figure 4:
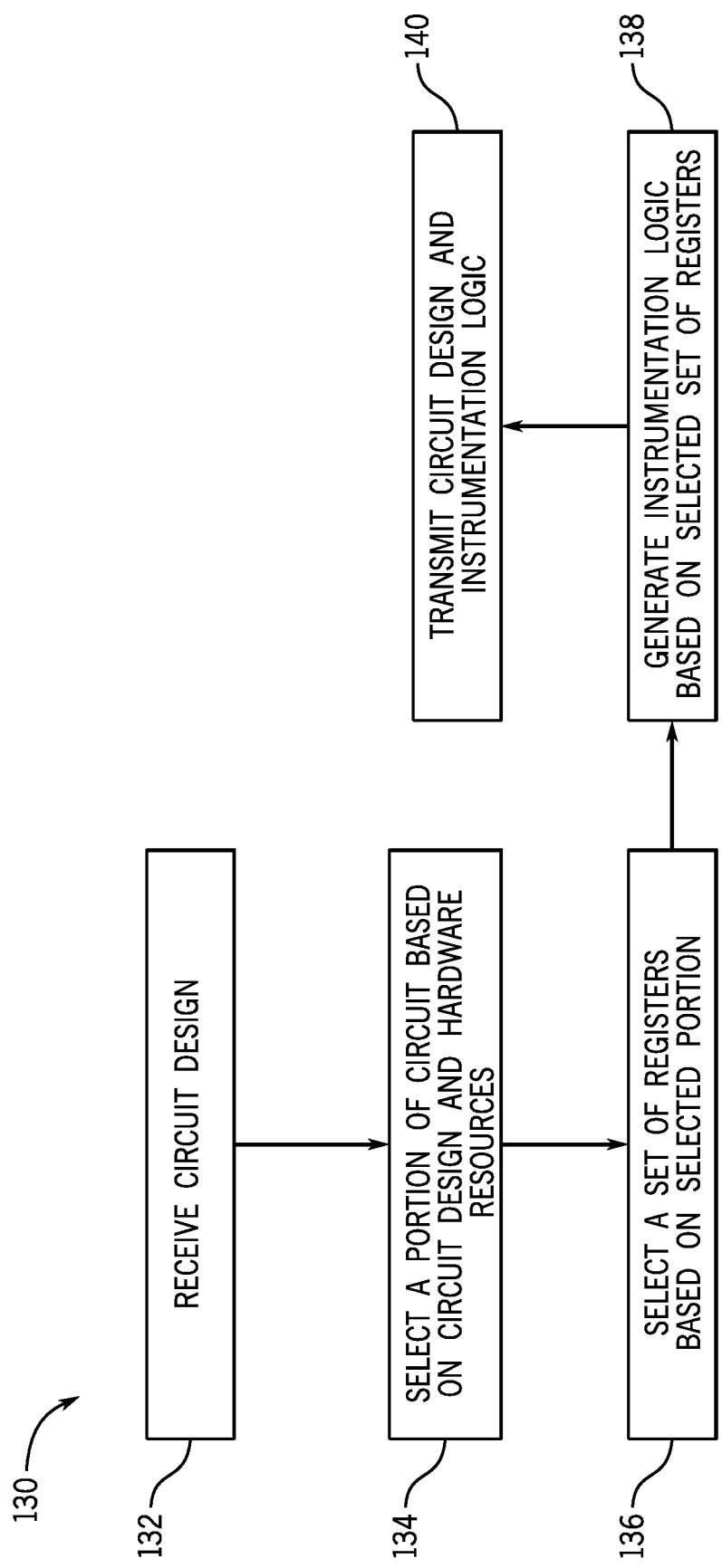
FIG. 4 is a flow diagram of a process for generating instrumentation logic for a circuit design intended to be implemented on a programmable logic device, in accordance with an embodiment of the present disclosure.

FIG. 4 illustrates a flow diagram of a process 130 for generating instrumentation logic for sampling a circuit design intended to be implemented by a programmable logic device, according to embodiments of the present disclosure. While the process 130 is described as being performed by a host processor, such as host 18 in FIG. 1, it should be understood that the process 130 may be performed by any suitable processing circuitry. Furthermore, while the process 130 is described using steps in a specific sequence, it should be understood that the present disclosure contemplates that the described steps may be performed in different sequences than the sequence illustrated, and certain described steps may be implemented by executing instructions stored in a tangible, non-transitory, computer-readable medium using any suitable processing circuitry.

In the process 130, a circuit design, such as circuit design 104 may be received at a host (block 132), such as host 18 in FIG. 1. In certain embodiments, the host may generate the circuit design. A compiler of the host may compile the circuit design. In certain embodiments, the compiler generates a set of binary execution codes based on the circuit design. The set of binary execution codes define a schedule of computation associated with the circuit design. The binary execution codes, when executed by suitable processing circuitry or an integrated circuit device, such as an FPGA, will implement a circuit based on the circuit design.

In the process 130, the host may select (block 134) a portion of a circuit associated with the circuit design and intended to be implemented on a programmable logic device based on the circuit design and hardware resources associated with the programmable logic device. In some embodiments, the host may receive a selection of a portion of the circuit from a user, such as a designer of the circuit design. For example, the user may select the portion based on what the user believes is a bug associated with the circuit design 104. Alternatively, the host may select the portion based on the circuit design and available hardware resources.

In the process 130, the host may select (block 136) a set of registers based on the circuit design and the selected portion of the circuit. The host may use any suitable algorithm, such as a greedy algorithm or a heuristic algorithm in selecting the set of registers. In some embodiments, the algorithm may be intended to reduce a total number of samples taken at the set of registers.

In the process 130, the host may generate instrumentation logic (block 138) based on the selection. For example, a compiler of the host may compile the instrumentation logic. In certain embodiments, the compiler generates a set of binary execution codes based on the instrumentation logic. The set of binary execution codes define a schedule of computation associated with the instrumentation logic. The binary execution codes, when executed by suitable processing circuitry or an integrated circuit device, such as an FPGA, will implement a signal data collection process during implementation of the associated circuit design.

In some embodiments, the process 130 includes transmitting (step 140) the circuit design and the instrumentation logic. For example, the FPGA bitstream may be stored and may be prepared for transmittal as described herein.

Figure 5:
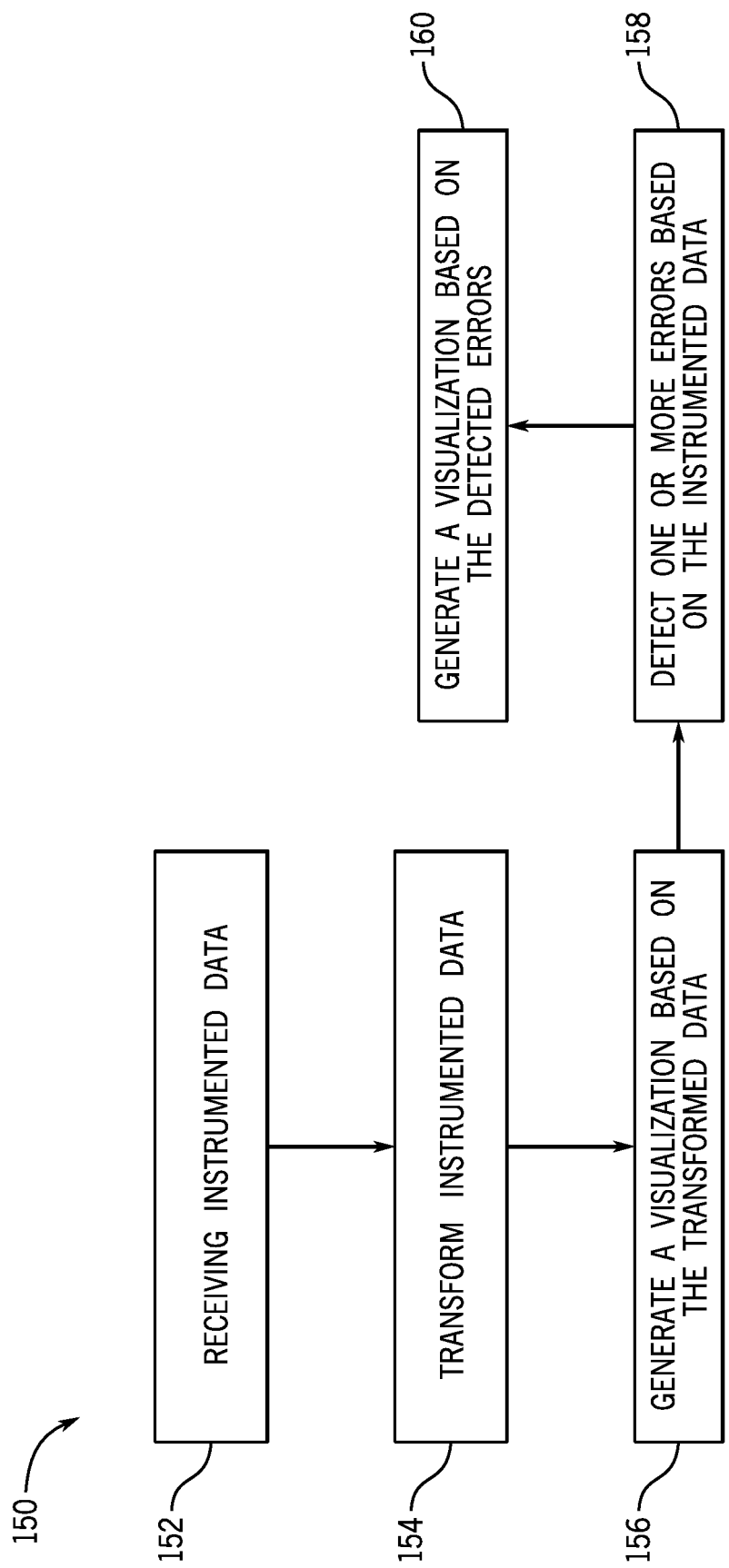
FIG. 5 is a flow diagram of a process for debugging a circuit design for a programmable logic device, in accordance with an embodiment of the present disclosure.

FIG. 5 illustrates a flow diagram of a process 150 for visualization of a circuit design, debugging, and error detection in a circuit design intended to be implemented by a programmable logic device, according to embodiments of the present disclosure. While the process 150 is described as being performed by a host processor, such as host 18 in FIG. 1, it should be understood that the process 150 may be performed by any suitable processing circuitry. Furthermore, while the process 150 is described using steps in a specific sequence, it should be understood that the present disclosure contemplates that the described steps may be performed in different sequences than the sequence illustrated, and certain described steps may be implemented by executing instructions stored in a tangible, non-transitory, computer-readable medium using any suitable processing circuitry.

In the process 150, instrumented data, such as instrumented data 122 may be received at a host (block 152), such as host 18 in FIG. 1. In certain embodiments, the instrumented data may be transmitted to the host from an FPGA, such as FPGA 112. For example, the signal collector 120 may collect and may transmit the instrumented data 122 for transformation and analysis by the host.

In the process 150, the host may transform (block 154) the instrumented data via a signal analyzer, such as signal analyzer 124. For example, the signal analyzer 124 may transform the instrumented data 122 and may generate a visualization of the instrumented data 122. In certain embodiments, the visualization may display the instrumented data 122 in a waveform format, a signal trace format, a source file debug format, or any combination thereof. Additionally or alternatively, the signal analyzer 124 may use hardware description language to transform the instrumented data 122. In some embodiments, the signal analyzer 124 may utilize a programmable interface, such as Verilog procedural interface, programming language interface, direct programing interface, or the like, to transform the instrumented data 122 into a set of transformed data.

In the process 150, the host may generate a visualization based on the transformed data (block 156). For example, the signal analyzer 124 may generate a visualization of the instrumented data 122. As such, the visualization may provide a user with a better understanding of the implementation of the circuit design on the programmable logic device, such as FPGA 112. In certain embodiments, the visualization may display the instrumented data 122 in a waveform format, a signal trace format, a source file debug format, or any combination thereof. Additionally or alternatively, the signal analyzer 124 may use hardware description language to transform the instrumented data 122. In some embodiments, the signal analyzer 124 may utilize a programmable interface, such as Verilog procedural interface, programming language interface, direct programing interface, or the like, to transform the instrumented data 122 into a set of transformed data.

In the process 150, the host may detect one or more errors (block 158) based on the transformed instrumented data. For example, the signal analyzer 124 may utilize a simulator and may simulate the circuit design 104 based on the instrumented data 122. The signal analyzer 124 may detect one or more errors associated with the implementation of the circuit on the FPGA 112 based on the simulation of the circuit and the implementation of the circuit on the FPGA 112. For example, the signal analyzer 124 may detect inconsistencies between a result of associated with the simulation of the circuit and a result (e.g., instrumented data 122) associated with the implementation of the circuit on the FPGA 112. Additionally or alternatively, the signal analyzer may detect one or more errors based on a model (e.g., register-transfer level) of the circuit generated by the signal analyzer 124 for the simulation and the implementation of the circuit on the FPGA 112.

In some embodiments, the host may generate a visualization (block 160) based on the detected errors and may report any number of errors. For example, the visualization may include a portion indicative of detected errors.

Figure 6:
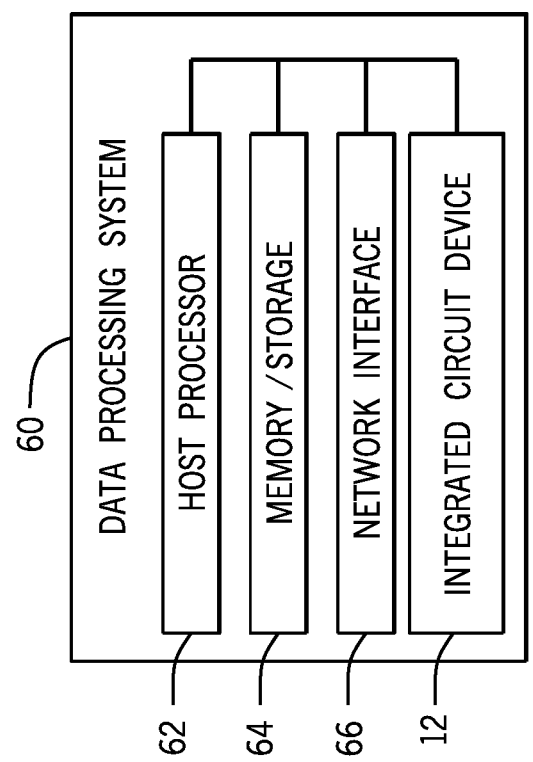
FIG. 6 is a data processing system, in accordance with an embodiment of the present disclosure.

The integrated circuit device 12 may be a data processing system or a component included in a data processing system. For example, the integrated circuit device 12 may be a component of a data processing system 60 shown in FIG. 6. The data processing system 60 may include a host processor 62 (e.g., a central-processing unit (CPU)), memory and/or storage circuitry 64, and a network interface 66. The data processing system 60 may include more or fewer components (e.g., electronic display, user interface structures, application specific integrated circuits (ASICs)). The host processor 62 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 60 (e.g., to perform debugging, data analysis, encryption, decryption, machine learning, video processing, voice recognition, image recognition, data compression, database search ranking, bioinformatics, network security pattern identification, spatial navigation, or the like). The memory and/or storage circuitry 64 may include random access memory (RAM), read-only memory (ROM), one or more hard drives, flash memory, or the like. The memory and/or storage circuitry 64 may hold data to be processed by the data processing system 60. In some cases, the memory and/or storage circuitry 64 may also store configuration programs (bitstreams) for programming the integrated circuit device 12. The network interface 66 may allow the data processing system 60 to communicate with other electronic devices. The data processing system 60 may include several different packages or may be contained within a single package on a single package substrate.

In one example, the data processing system 60 may be part of a data center that processes a variety of different requests. For instance, the data processing system 60 may receive a data processing request via the network interface 66 to perform debugging, error detection, data analysis, encryption, decryption, machine learning, video processing, voice recognition, image recognition, data compression, database search ranking, bioinformatics, network security pattern identification, spatial navigation, digital signal processing, or some other specialized task.

Accordingly, the techniques described herein enable particular applications to be carried out using debugging and error detection on a programmable logic device, such as an FPGA. For example, circuit design and signal data collection for a circuit to be implemented on an FPGA, such as FPGA 112, enables accurate debugging and error detection enhances the ability of integrated circuit devices, such as programmable logic devices (e.g., FPGAs), to be utilized for debugging applications while still being suitable for digital signal processing applications.

While the embodiments set forth in the present disclosure refer to deep learning models, it should be understood that the disclosure is not intended to be limited to such deep learning models. The disclosure is to cover all machine learning models, such as deep learning models, neural networks, classifiers, cluster analysis, support vector machines, and any other suitable machine learning model. While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

EXAMPLE EMBODIMENTS OF THE DISCLOSURE

The following numbered clauses define certain example embodiments of the present disclosure.

CLAUSE 1.

A method comprising:
retrieving, at a host device, a circuit design configured to implement a circuit on an integrated circuit device, wherein the circuit comprises a set of registers and a set of inputs associated with at least one register of the set of registers;
receiving, at the host device, a selection of a portion of the circuit based on the circuit design;
selecting, at the host device, a first subset of the set of registers and a subset of the set of inputs based on the selection;
generating, at the host device, instrumentation logic based on the selected first subset of the set of registers, wherein the instrumentation logic is configured to collect signal data from the selected first subset of the set of registers during implementation of the circuit on the integrated circuit device.

CLAUSE 2.

The method of clause 1, wherein the circuit comprises a set of feedback loops and wherein each feedback loop comprises at least one register of the set of registers.

CLAUSE 3.

The method of clause 2, wherein at least one register of the first subset of the set of registers is associated with at least one feedback loop of the set of feedback loops.

CLAUSE 4.

The method of clause 2, wherein each feedback loop of the set of feedback loops is associated with a corresponding register of the first subset of the set of registers.

CLAUSE 5.

The method of clause 2, wherein the instrumentation logic is configured to take only one sample for each register of the selected first subset of the set of registers.

CLAUSE 6.

The method of clause 1, comprising compiling a bitstream configured to be transmitted to the integrated circuit device, wherein the bitstream comprises the circuit design and the instrumentation logic.

CLAUSE 7.

The method of clause 6, comprising transmitting the bitstream to the integrated circuit device.

CLAUSE 8.

The method of clause 6, wherein the bitstream is a configuration bitstream of a field programmable gate array (FPGA).

CLAUSE 9.

The method of clause 1, comprising generating, at the host device, the circuit design.

CLAUSE 10.

A system, comprising:
an integrated circuit device configured to implement a circuit design, wherein the circuit design comprises a set of registers, the integrated circuit device comprising:
a communication interface configured to receive the circuit design in a configuration bitstream and instrumentation logic in the configuration bitstream; and
a signal collector block configured to collect signal data from a subset of the set of registers based on the instrumentation logic during implementation of the circuit design.

CLAUSE 11.

The system of clause 10, wherein the signal collector block is configured to collect the signal data from a set of registers based on the instrumentation logic.

CLAUSE 12.

The system of clause 10, wherein the communication interface is configured to transmit the signal data to a host device.

CLAUSE 13.

The system of clause 12, comprising the host device, wherein the host device is configured to detect one or more errors associated with the circuit design based on the signal data.

CLAUSE 14.

The system of clause 13, wherein the host device is configured to generate the instrumentation logic based on a selection of the subset of the set of registers.

CLAUSE 15.

The system of clause 10, wherein the circuit design is associated with functionality of the integrated circuit device.

CLAUSE 16.

The system of clause 10, wherein the integrated circuit device comprises a field-programmable gate array (FPGA).

CLAUSE 17.

A non-transitory, computer readable medium comprising instructions that, when executed, are configured to cause a processor to perform operations comprising:
receiving signal data at a host device, from an integrated circuit device, wherein the signal data corresponds to implementation of a circuit design on the integrated circuit device, and wherein the signal data is associated with a portion of the circuit design; and
generating, at the host device, a visualization associated with the portion of the circuit design based on the signal data.

CLAUSE 18.

The non-transitory, computer readable medium of clause 17, wherein the instructions that, when executed, are configured to cause the processor to perform operations comprising generating a simulation of the portion of the circuit design based on the signal data.

CLAUSE 19.

The non-transitory, computer readable medium of clause 18, wherein the instructions that, when executed, are configured to cause the processor to perform operations comprising comparing, at the host device, the simulation and the circuit design.

CLAUSE 20.

The non-transitory, computer readable medium of clause 17, wherein the instructions that, when executed, are configured to cause the processor to perform operations comprising transforming the signal data via hardware description language, a programmable interface, or a combination thereof.

What is claimed is:

1. A method comprising:
retrieving, at a host device, a circuit design configured to implement a circuit on an integrated circuit device, wherein the circuit comprises a set of registers and a set of inputs associated with at least one register of the set of registers;
receiving, at the host device, a selection of a portion of the circuit based on the circuit design;
selecting, at the host device, a first subset of the set of registers and a subset of the set of inputs based on the selection; and generating, at the host device, instrumentation logic based on the selected first subset of the set of registers, wherein the instrumentation logic is configured to collect signal data from the selected first subset of the set of registers during implementation of the circuit on the integrated circuit device.

2. The method of claim 1, wherein the circuit comprises a set of feedback loops and wherein each feedback loop comprises at least one register of the set of registers.

3. The method of claim 2, wherein the at least one register of the selected first subset of the set of registers is associated with at least one feedback loop of the set of feedback loops.

4. The method of claim 2, wherein each feedback loop of the set of feedback loops is associated with a corresponding register of the selected first subset of the set of registers.

5. The method of claim 2, wherein the instrumentation logic is configured to take only one sample for each register of the selected first subset of the set of registers.

6. The method of claim 1, comprising compiling a bitstream configured to be transmitted to the integrated circuit device, wherein the bitstream comprises the circuit design and the instrumentation logic.

7. The method of claim 6, comprising transmitting the bitstream to the integrated circuit device.

8. The method of claim 6, wherein the bitstream is a configuration bitstream of a field programmable gate array (FPGA).

9. The method of claim 1, comprising generating, at the host device, the circuit design.

* * * * *